United States Patent [19]
Yang et al.

[11] Patent Number: 5,792,374
[45] Date of Patent: Aug. 11, 1998

US005792374A

[54] METHOD OF FABRICATING A COLOR IMAGE SENSOR FROM A GRAY SCALE IMAGE SENSOR

[75] Inventors: Thomas Yang; Liang-Chung Wu; Shang-Tarng Jan. all of Hsinchu, Taiwan

[73] Assignee: Hualon Microelectronics Corporation. Hsinchu, Taiwan

[21] Appl. No.: 647,775

[22] Filed: May 15, 1996

[51] Int. Cl.$^6$ .................................................. B44C 1/22
[52] U.S. Cl. .................................. 216/24; 216/41; 216/75
[58] Field of Search .................................. 216/24, 2, 38, 216/33, 41, 67, 75, 77

[56] References Cited

U.S. PATENT DOCUMENTS

| | | | |
|---|---|---|---|
| 5,340,619 | 8/1994 | Chen et al. | 216/24 X |
| 5,364,498 | 11/1994 | Chen | 216/24 |

*Primary Examiner*—William Powell
*Attorney, Agent, or Firm*—Foley & Lardner

[57] ABSTRACT

A method of fabricating a color image sensor includes the steps of: (a) providing a gray scale image sensor with an array of photoelectric converting cells and a plurality of bonding pads on a substrate; (b) applying a first transparent layer on surface of the gray scale image sensor; (c) successively forming first, second and third color filter patterns on the first transparent layer, the first color filter pattern being disposed directly above a first group of the photoelectric converting cells, the second color filter pattern being disposed directly above a second group of the photoelectric converting cells, the third color filter pattern being disposed directly above a third group of the photoelectric converting cells; (d) coating a second transparent layer on the color filter patterns and on portions of the first transparent layer not covered by the color filter patterns; (e) depositing a metal layer on the second transparent layer; (f) patterning and etching the metal layer so as to remove portions of the metal layer, the second transparent layer and the first transparent layer which are directly above the bonding pads to expose the bonding pads; and (g) removing remaining portions of the metal layer.

15 Claims, 10 Drawing Sheets

METHOD OF FABRICATING A COLOR IMAGE SENSOR FROM A GRAY SCALE IMAGE SENSOR

BACKGROUND OF THE INVENTION

1. Field of the Invention

The invention relates to an image sensor, more particularly to a method of fabricating a color image sensor from a gray scale image sensor.

2. Description of the Related Art

Presently, there are two types of image sensors that are available in the market. The first type is a gray scale image sensor that includes a plurality of photoelectric converting cells and bonding pads for external connection purposes. The second type is a color image sensor which essentially is a gray scale image sensor with color filter films provided thereon.

The main drawback of converting a gray scale image sensor into a color image sensor is as follows: The surface of the gray scale image sensor is not substantially flat. Usually, the difference between peaks and valleys in the surface of the gray scale image sensor can reach up to 3 micrometers. Thus, direct application of the color filter films on the surface of the gray scale image sensor will result in an uneven surface such that the resolution of the color image sensor is relatively poor.

SUMMARY OF THE INVENTION

The main object of the present invention is to provide a method of fabricating a color image sensor from a gray scale image sensor, wherein the resulting color image sensor can provide good resolution.

According to the present invention, a method of fabricating a color image sensor comprises the steps of:

(a) providing a gray scale image sensor with an array of photoelectric converting cells and a plurality of bonding pads on a substrate;

(b) applying a first transparent layer on surface of the gray scale image sensor;

(c) successively forming first, second and third color filter patterns on the first transparent layer, the first color filter pattern being disposed directly above a first group of the photoelectric converting cells, the second color filter pattern being disposed directly above a second group of the photoelectric converting cells, the third color filter pattern being disposed directly above a third group of the photoelectric converting cells;

(d) coating a second transparent layer on the color filter patterns and on portions of the first transparent layer not covered by the color filter patterns;

(e) depositing a metal layer on the second transparent layer;

(f) patterning and etching the metal layer so as to remove portions of the metal layer, the second transparent layer and the first transparent layer which are directly above the bonding pads to expose the bonding pads, the step (f) including the sub-steps: (i) coating a first photoresist layer on the metal layer; (ii) with the use of a first mask, exposing portions of the first photoresist layer to light so as to pattern the metal layer; (iii) etching the metal layer so as to remove the portions of the metal layer, the second transparent layer and the first transparent layer which are directly above the bonding pads; and (iv) removing the first photoresist layer; and (g) removing remaining portions of the metal layer.

Preferably, the exposed portions of the first photoresist layer are slightly smaller than respective ones of the bonding pads, and the step (g) includes the sub-steps of: (v) coating a second photoresist layer on remaining portions of the metal layer and on the bonding pads; (vi) with the use of a second mask, exposing portions of the second photoresist layer to light so as to pattern the metal layer, non-exposed portions of the second photoresist layer being disposed directly above the bonding pads and being slightly larger than the exposed portions of the first photoresist layer in sub-step (ii); (vii) etching the metal layer to remove portions of the metal layer which are not covered by the non-exposed portions of the second photoresist layer, thereby forming looped metal pieces on the second transparent layer above and around the bonding pads; and (vii) removing the second photoresist layer.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
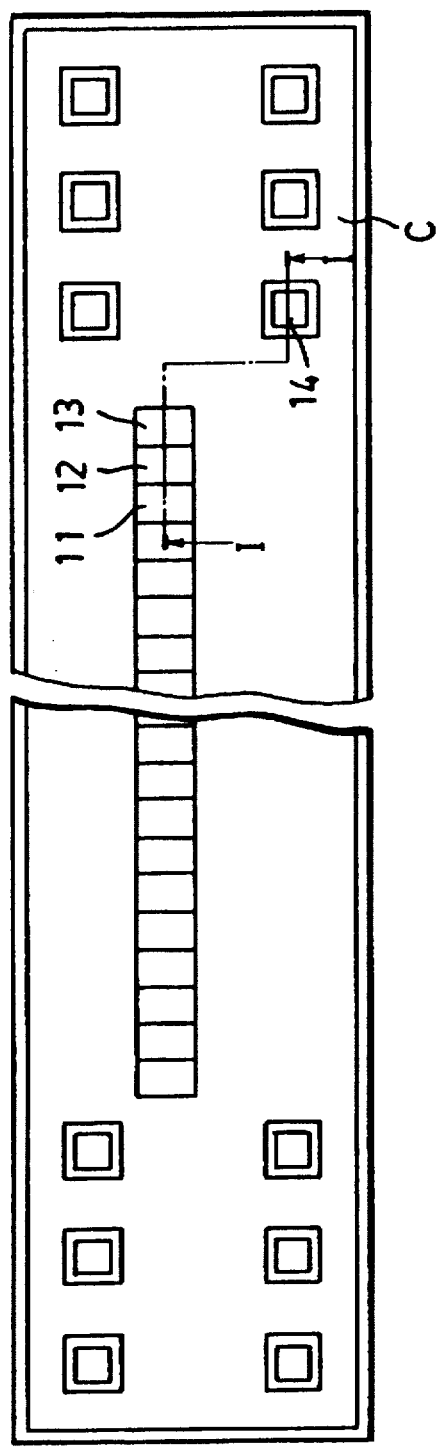
FIG. 1 is a schematic plan view of a color image sensor of the present invention.

As shown in FIG. 1, a color image sensor (C) fabricated according to the method of the present invention is shown to include a linear array of photoelectric converting cells 11, 12, 13 and a plurality of bonding pads 14. FIGS. 2 to 10 are sectional views taken from line I—I in FIG. 1 and illustrate the fabricating method of the preferred embodiment. To simplify the description of the preferred embodiment, only three photoelectric converting cells 11, 12, 13 and one bonding pad 14 is shown in FIGS. 2 to 10.

Figure 2:
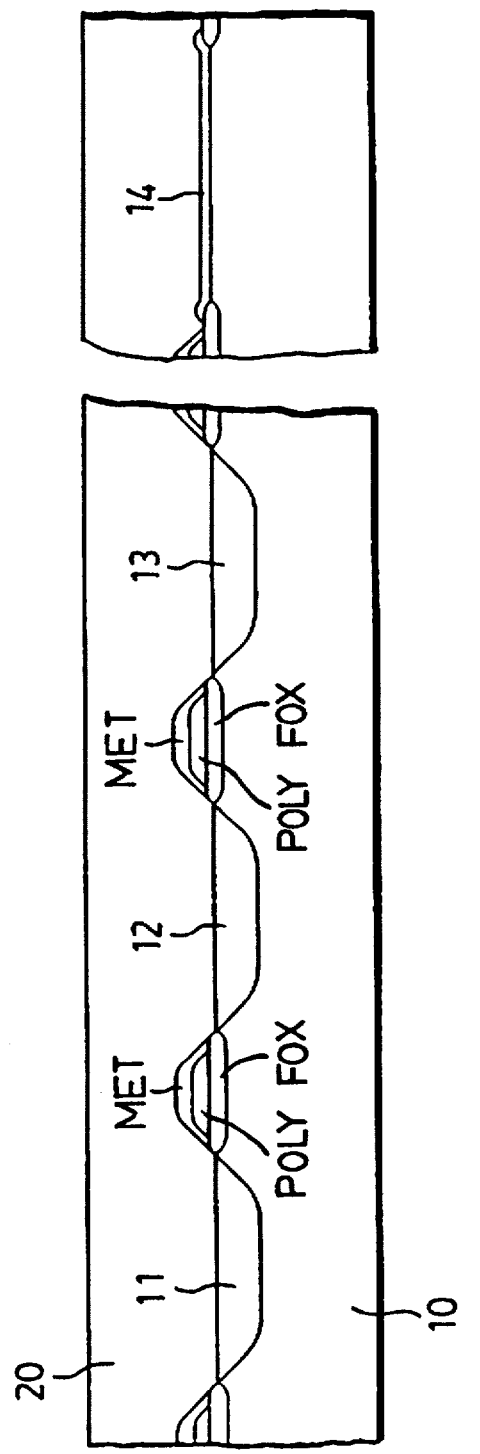
FIGS. 2 to 10 are cross-sectional views which illustrate the steps of the preferred embodiment of the method of fabricating a color image sensor from a conventional gray scale image sensor in accordance with the present invention.

The preferred embodiment of a method of fabricating a color image sensor from a gray scale image sensor in accordance with the present invention includes the following steps:

1. As shown in FIG. 2, a gray scale image sensor 10, which includes a linear array of photoelectric converting cells 11, 12, 13 and bonding pads 14 on a substrate, is initially provided. Examples of gray scale image sensors that can be used include HML1530 and HML1210 by Hualon Microelectronics Corp. of Taiwan and TCD1500C and TCD1200D by Toshiba of Japan.

2. A first transparent layer 20, such as a high molecular weight polymer resin layer, is applied on the surface of the gray scale image sensor 10 to smoothen the latter.

Figure 3:
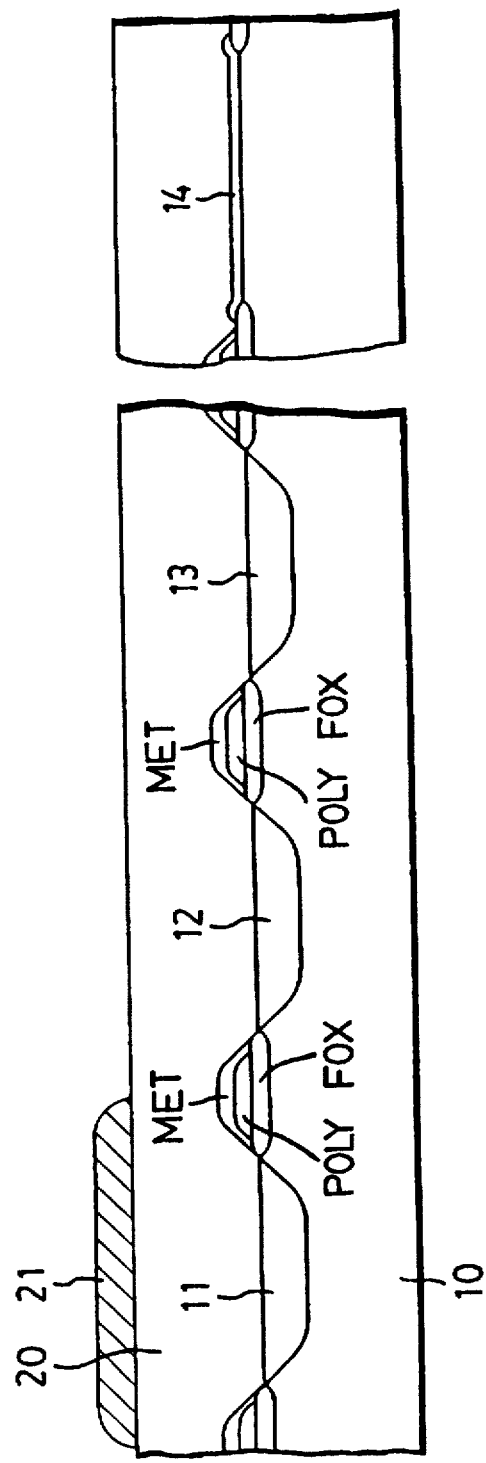

3. Referring to FIG. 3, a first color filter pattern 21 is formed on the first transparent layer 20 and is disposed directly above a first group of the photoelectric converting cells 11. The first color filter pattern 21 is formed by patterning, etching and baking a first color filter film, such as a red filter film, which is applied on the first transparent layer 20.

Figure 4:
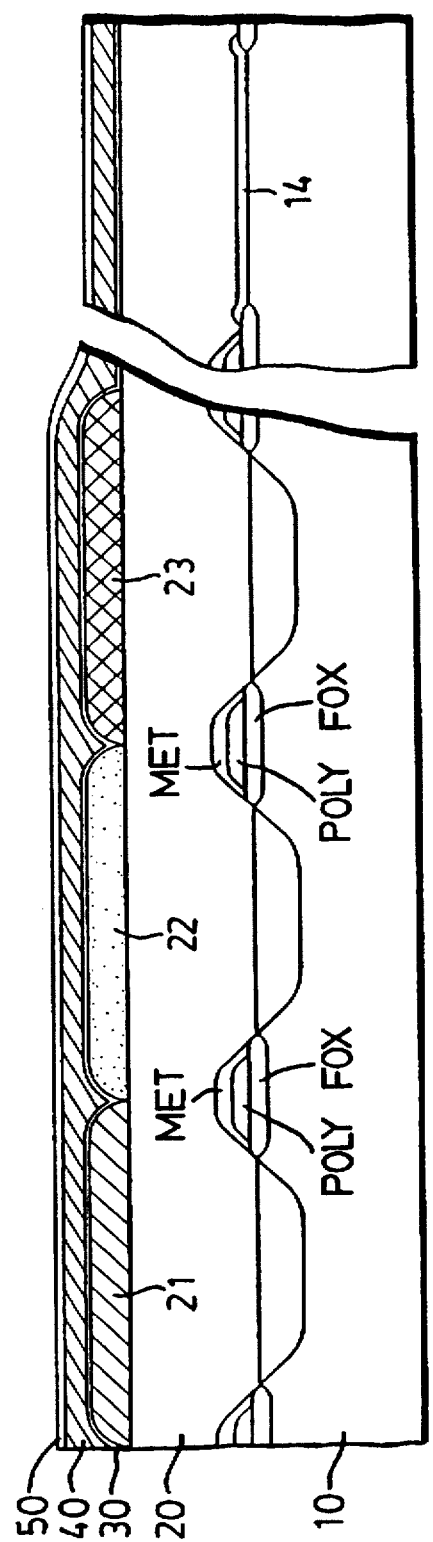

4. Referring to FIG. 4, second and third color filter patterns 22, 23 are successively formed on the first transparent layer 20 in a manner similar to that of the first color filter pattern 21. The second color filter pattern 22 is disposed directly above a second group of the photoelectric converting cells 12 and is formed by patterning, etching and baking a second color filter film, such as a green filter film, which is applied on the first transparent layer 20. The third color filter pattern 23 is disposed directly above a third group of the photoelectric converting cells 13 and is formed by patterning, etching and baking a third color filter film, such as a blue filter film, which is applied on the first transparent layer 20.

5. Subsequent to the formation of the first, second and third color filter patterns 21, 22, 23, a second transparent layer 30 having a thickness of about 0.1 μm is coated on the color filter patterns 21, 22, 23 and on portions of the first transparent layer 20 not covered by the color filter patterns 21, 22, 23. The second transparent layer 30, which is a resin layer, serves as a protective layer for the color filter patterns 21, 22, 23. A metal layer 40 is then deposited on the second transparent layer 30 via known metal sputtering techniques. The metal layer 40 is preferably made of aluminum so as to minimize pollution and since aluminum sputtering equipments are readily available in most manufacturing plants.

Figure 5:
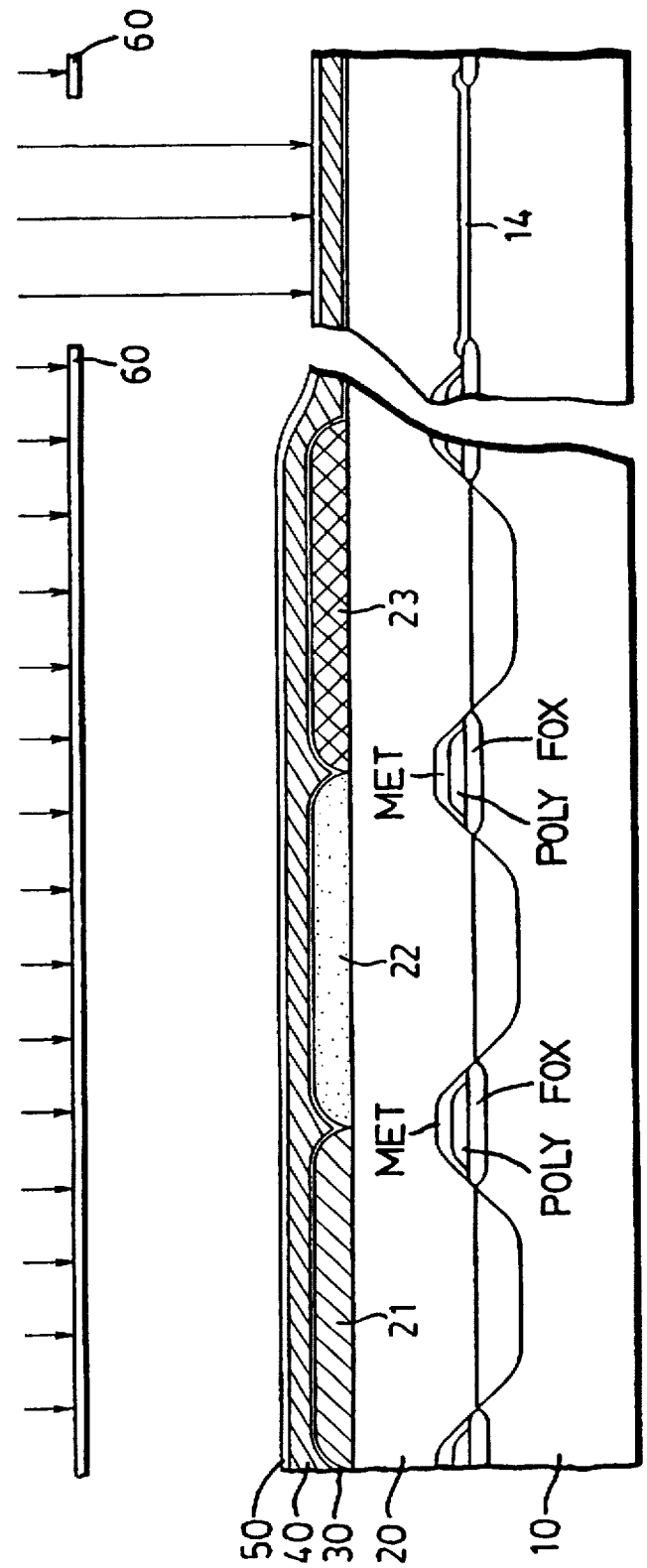
Figure 6:
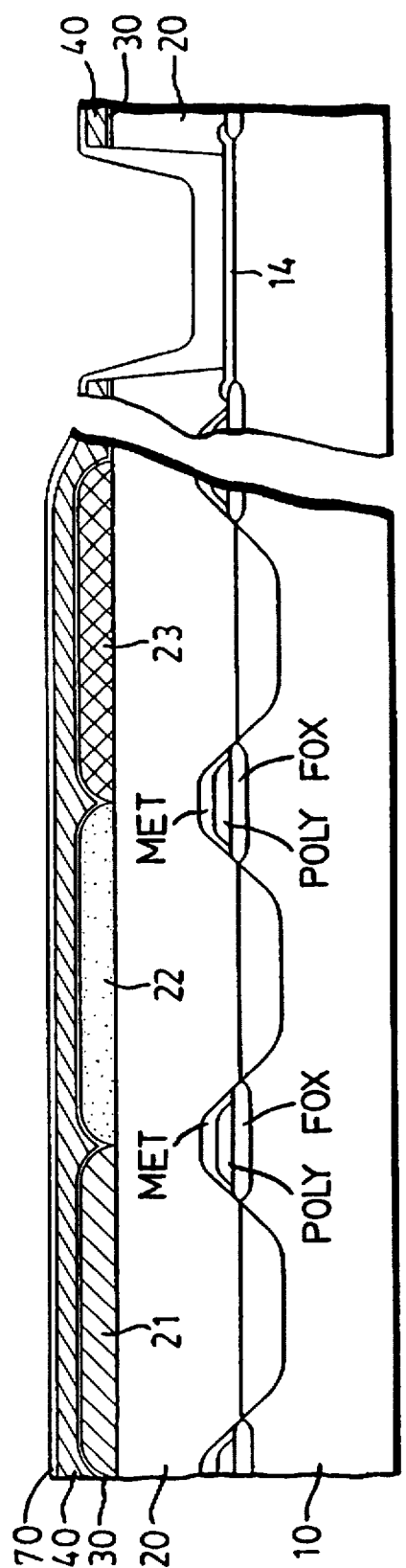

6. Patterning and etching of the metal layer 40 is performed to expose the bonding pads 14. As shown in FIG. 4, a first photoresist layer 50, preferably a positive photoresist layer, is coated on the metal layer 40. Referring to FIG. 5, with the use of a first mask 60, portions of the first photoresist layer 50 are exposed to light so as to pattern the metal layer 40, the exposed portions of the first photoresist layer 50 being slightly smaller than respective ones of the bonding pads 14. Dry etching is then performed to remove portions of the metal layer 40, the second transparent layer 30 and the first transparent layer 20 which are directly above the bonding pads 14 to expose the latter, as shown in FIG. 6.

Figure 7:
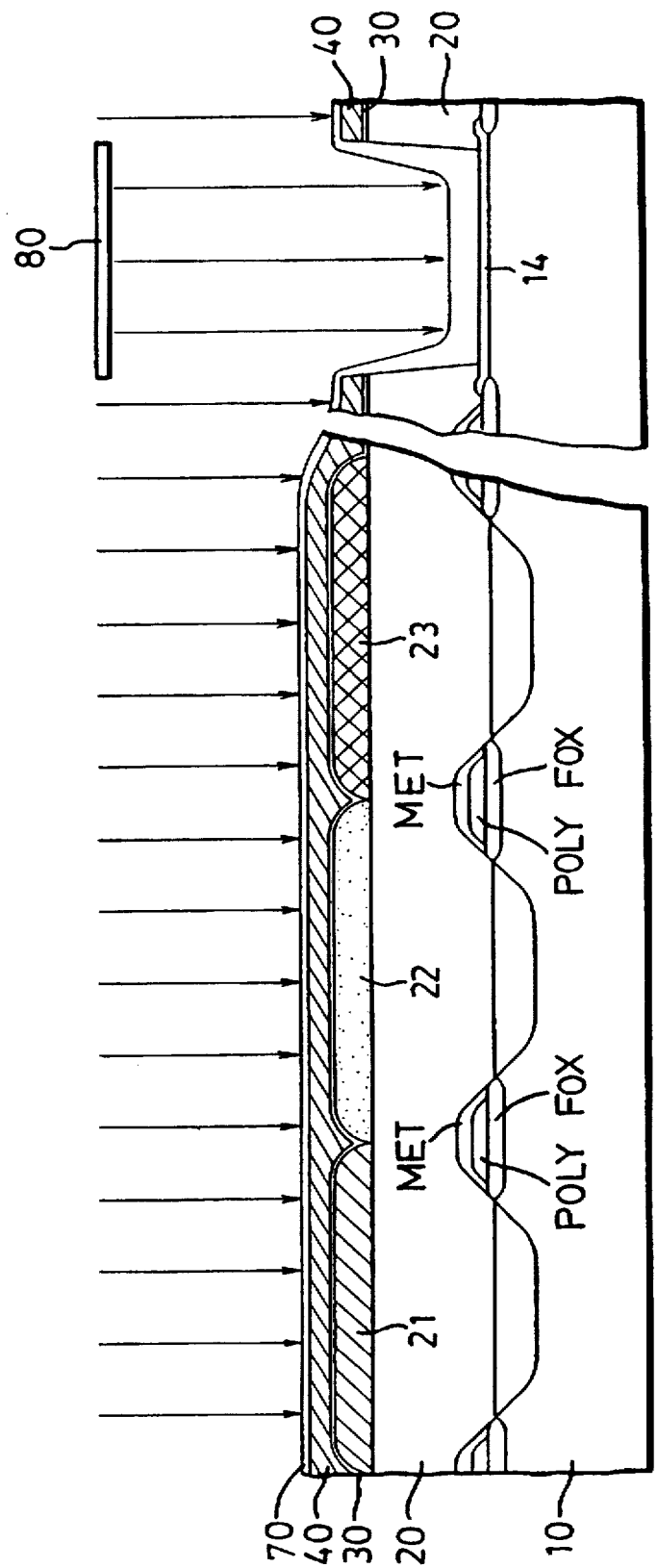
Figure 8:
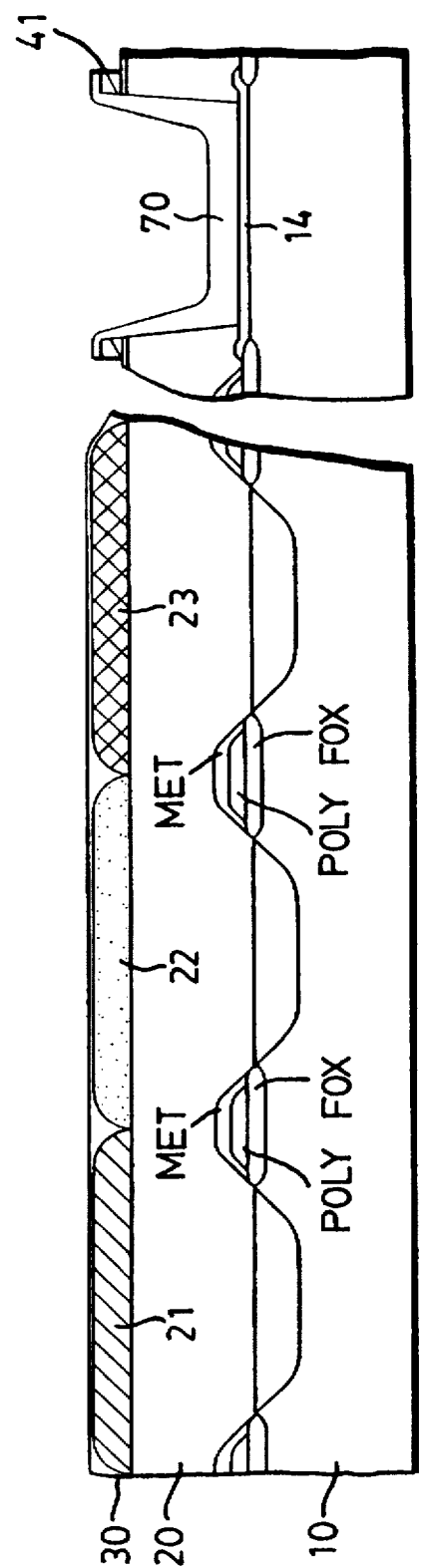

7. Referring again to FIG. 6, the first photoresist layer 50 is removed, and a second photoresist layer 70, preferably a positive photoresist layer, is coated on the remaining portions of the metal layer 40 and on the bonding pads 14. As shown in FIGS. 7 and 8, with the use of a second mask 80, portions of the second photoresist layer 70 are exposed to light so as to pattern the metal layer 40. The non-exposed portions of the second photoresist layer 70 are disposed directly above the bonding pads 14 and are slightly larger than the exposed portions of the first photoresist layer 50 (see FIG. 5).

8. Thereafter, as shown in FIG. 8, dry etching is performed to remove portions of the metal layer 40 which are not covered by the non-exposed portions of the second photoresist layer 70. At this time, looped metal pieces 41 are formed on the second transparent layer 30 above and around the bonding pads 14.

Figure 9:
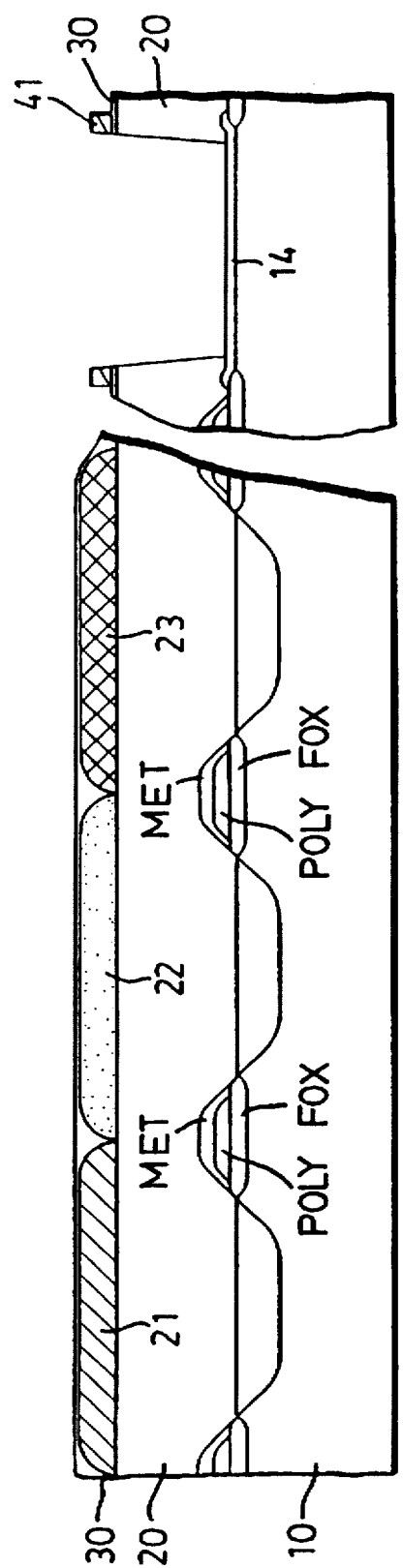

9. Finally, the second photoresist layer 70 is removed, as shown in FIG. 9. Metal contacts (not shown) can be formed at this time for external connection purposes.

Figure 10:
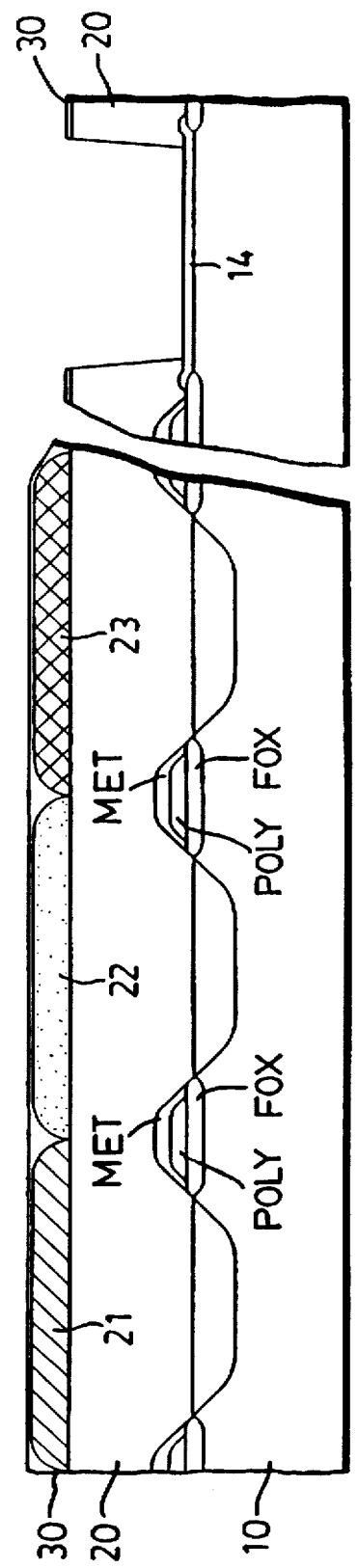

It should be noted that the formation of the metal pieces 41, which are located at overlapping sections of the first and second masks 60, 80, prevents over etching of the bonding pads 14 during the dry etching operations and do not affect operation of the color image sensor. If desired, an optional step of removing the metal pieces 41 may be performed after the second photoresist layer 70 has been removed, as shown in FIG. 10.

The presence of the first and second transparent layers 20, 30 ensures that the color image sensor will have a smooth surface to result in good resolution. In addition, since the bonding pads 14 are covered by the first transparent layer 20 during the formation of the first, second and third color filter patterns 21, 22, 23, oxidation or corrosion of the bonding pads 14 can be minimized.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

We claim:

1. A method of fabricating a color image sensor, comprising the steps of:
   (a) providing a gray scale image sensor with an array of photoelectric converting cells and a plurality of bonding pads on a substrate;
   (b) applying a first transparent layer on surface of the gray scale image sensor;
   (c) successively forming first, second and third color filter patterns on the first transparent layer, the first color filter pattern being disposed directly above a first group of the photoelectric converting cells, the second color filter pattern being disposed directly above a second group of the photoelectric converting cells, the third color filter pattern being disposed directly above a third group of the photoelectric converting cells;
   (d) coating a second transparent layer on the color filter patterns and on portions of the first transparent layer not covered by the color filter patterns;
   (e) depositing a metal layer on the second transparent layer;
   (f) patterning and etching the metal layer so as to remove portions of the metal layer, the second transparent layer and the first transparent layer which are directly above the bonding pads to expose the bonding pads; and
   (g) removing remaining portions of the metal layer.

2. The method as claimed in claim 1, wherein the first transparent layer is made of a high molecular weight polymer resin.

3. The method as claimed in claim 1, wherein, in step (c), each of the first, second and third color filter patterns is formed by patterning, etching and baking a corresponding color filter film which is applied on the first transparent layer.

4. The method as claimed in claim 1, wherein, in step (c), the first, second and third color filter patterns are red, green and blue color filter patterns.

5. The method as claimed in claim 1, wherein the second transparent layer is a resin layer.

6. The method as claimed in claim 5, wherein the second transparent layer has a thickness of about 0.1 μm.

7. The method as claimed in claim 1, wherein the metal layer is an aluminum layer.

8. The method as claimed in claim 7, wherein the metal layer is deposited by metal sputtering.

9. The method as claimed in claim 1, wherein the step (f) comprises the sub-steps:
   (i) coating a first photoresist layer on the metal layer;
   (ii) with the use of a first mask, exposing portions of the first photoresist layer to light so as to pattern the metal layer;

(iii) etching the metal layer so as to remove the portions of the metal layer, the second transparent layer and the first transparent layer which are directly above the bonding pads; and (iv) removing the first photoresist layer.

10. The method as claimed in claim 9, wherein, in sub-step (iii), the metal layer is dry etched.

11. The method as claimed in claim 9, wherein the exposed portions of the first photoresist layer are slightly smaller than respective ones of the bonding pads.

12. The method as claimed in claim 11, wherein the step (g) comprises the sub-steps of:

(v) coating a second photoresist layer on remaining portions of the metal layer and on the bonding pads;

(vi) with the use of a second mask, exposing portions of the second photoresist layer to light so as to pattern the metal layer, non-exposed portions of the second photoresist layer being disposed directly above the bonding pads and being slightly larger than the exposed portions of the first photoresist layer in sub-step (ii);

(vii) etching the metal layer to remove portions of the metal layer which are not covered by the non-exposed portions of the second photoresist layer, thereby forming looped metal pieces on the second transparent layer above and around the bonding pads; and (viii) removing the second photoresist layer.

13. The method as claimed in claim 12, wherein the step (g) further comprises the sub-step:

(ix) removing the looped metal pieces from the second transparent layer.

14. The method as claimed in claim 12, wherein the first and second photoresist layers are positive photoresist layers.

15. The method as claimed in claim 12, wherein, in sub-step (vii), the metal layer is dry etched.

* * * * *